(12) United States Patent  
Ogiwara et al.

(10) Patent No.: US 8,259,513 B2  
(45) Date of Patent: Sep. 4, 2012

(54) INTERNAL VOLTAGE GENERATOR

(75) Inventors: Ryu Ogiwara, Yokohama (JP);  
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 234 days.

(21) Appl. No.: 12/835,615

(22) Filed: Jul. 13, 2010

(65) Prior Publication Data  
US 2011/0007579 A1    Jan. 13, 2011

(30) Foreign Application Priority Data  
Jul. 13, 2009    (JP) ................. 2009-164525

(51) Int. Cl.  
*G11C 5/14*    (2006.01)

(52) U.S. Cl. .............. 365/189.09; 341/118; 341/161

(58) Field of Classification Search ............ 365/189.09, 365/222, 207, 202, 211, 189.05, 189.08, 365/185.21, 212; 341/118, 119, 120, 121, 341/155, 158, 159, 160  
See application file for complete search history.

(56) References Cited

U.S. PATENT DOCUMENTS

| | | | |
|---|---|---|---|
| 4,973,974 A * | 11/1990 | Suzuki ................ | 341/118 |
| 6,898,104 B2 | 5/2005 | Ogiwara et al. | |
| 7,092,304 B2 | 8/2006 | Ogiwara et al. | |
| 2010/0066574 A1 * | 3/2010 | Bhakta et al. ........... | 341/118 |

OTHER PUBLICATIONS

H. Banba et al., "A CMOS Bandgap Reference Circuit with Sub-1-V Operation," IEEE Journal of Solid State Circuits, vol. 34, No. 5, pp. 670-674, May 1999.  
Background Art Information, Yasuka Kanazawa, Mar. 11, 2010.

* cited by examiner

*Primary Examiner* — Dang Nguyen  
(74) *Attorney, Agent, or Firm* — Knobbe, Martens, Olson & Bear, LLP

(57) ABSTRACT

An internal voltage generator according to an embodiment generates a reference voltage used for detecting data stored in a semiconductor memory. A first AD converter is configured to convert an external voltage supplied to the semiconductor memory into a first digital value. A second AD converter is configured to convert a temperature characteristic voltage that changes depending on a temperature of the semiconductor memory into a second digital value. An adder is configured to receive a reference voltage trimming address that specifies the reference voltage, the first digital value, and the second digital value, and to output a third digital value obtained by performing a weighted addition of the reference voltage trimming address, the first digital value, and the second digital value. A driver is configured to output the reference voltage responding to the third digital value.

8 Claims, 10 Drawing Sheets

INTERNAL VOLTAGE GENERATOR

CROSS REFERENCE TO RELATED APPLICATIONS

This application is based upon and claims the benefit of priority from the prior Japanese Patent Application No. 2009-164525, filed on Jul. 13, 2009, the entire contents of which are incorporated herein by reference.

FIELD

The embodiments of the present invention relate to an internal voltage generator.

BACKGROUND

In a 1T (Transistor)-1C (Capacitor) ferroelectric memory, a reference voltage VDC needs to be set to an intermediate potential between data "0" and data "1" for a sense amplifier to detect digital data. It is known that a potential of a bit line that transfers the data "0" and the data "1" depends on both a temperature and an array voltage VAA. Accordingly, the intermediate potential between the data "0" and the data "1" also changes with changes of the temperature and the array voltage VAA. The array voltage VAA is applied to a bit line and a plate line at the time of reading or writing data.

However, conventionally, the reference voltage VDC has not depended on both the temperature and the array voltage VAA. Particularly, in recent years, a sense margin of data has become stringent due to downscaling of a memory cell. Furthermore, an external power source voltage VDD has been lowered with the downscaling of the memory cell, and therefore, it is being considered to use the external power source voltage VDD as it is as the array voltage VAA. The external power source voltage VDD varies in a certain level of range. Therefore, when the reference voltage VDC is constant, it is highly possible that the reference voltage VDC is shifted from the intermediate potential between the data "0" and the data "1" due to changes of the temperature and the external power source voltage VDD (array voltage VAA), eventually causing the sense amplifier to detect data erroneously.

Besides, a degree of dependence (amount of dependence) of the reference voltage VDC on the temperature and the external power source voltage VDD (array voltage VAA) has never been considered before.

DETAILED DESCRIPTION

An internal voltage generator according to an embodiment generates a reference voltage used for detecting data stored in a semiconductor memory. A first AD converter is configured to convert an external voltage supplied to the semiconductor memory into a first digital value. A second AD converter is configured to convert a temperature characteristic voltage that changes depending on a temperature of the semiconductor memory into a second digital value. An adder is configured to receive a reference voltage trimming address that specifies the reference voltage, the first digital value, and the second digital value, and to output a third digital value obtained by performing a weighted addition of the reference voltage trimming address, the first digital value, and the second digital value. A driver is configured to output the reference voltage responding to the third digital value.

Embodiments will now be explained with reference to the accompanying drawings.

First Embodiment

Figure 1:
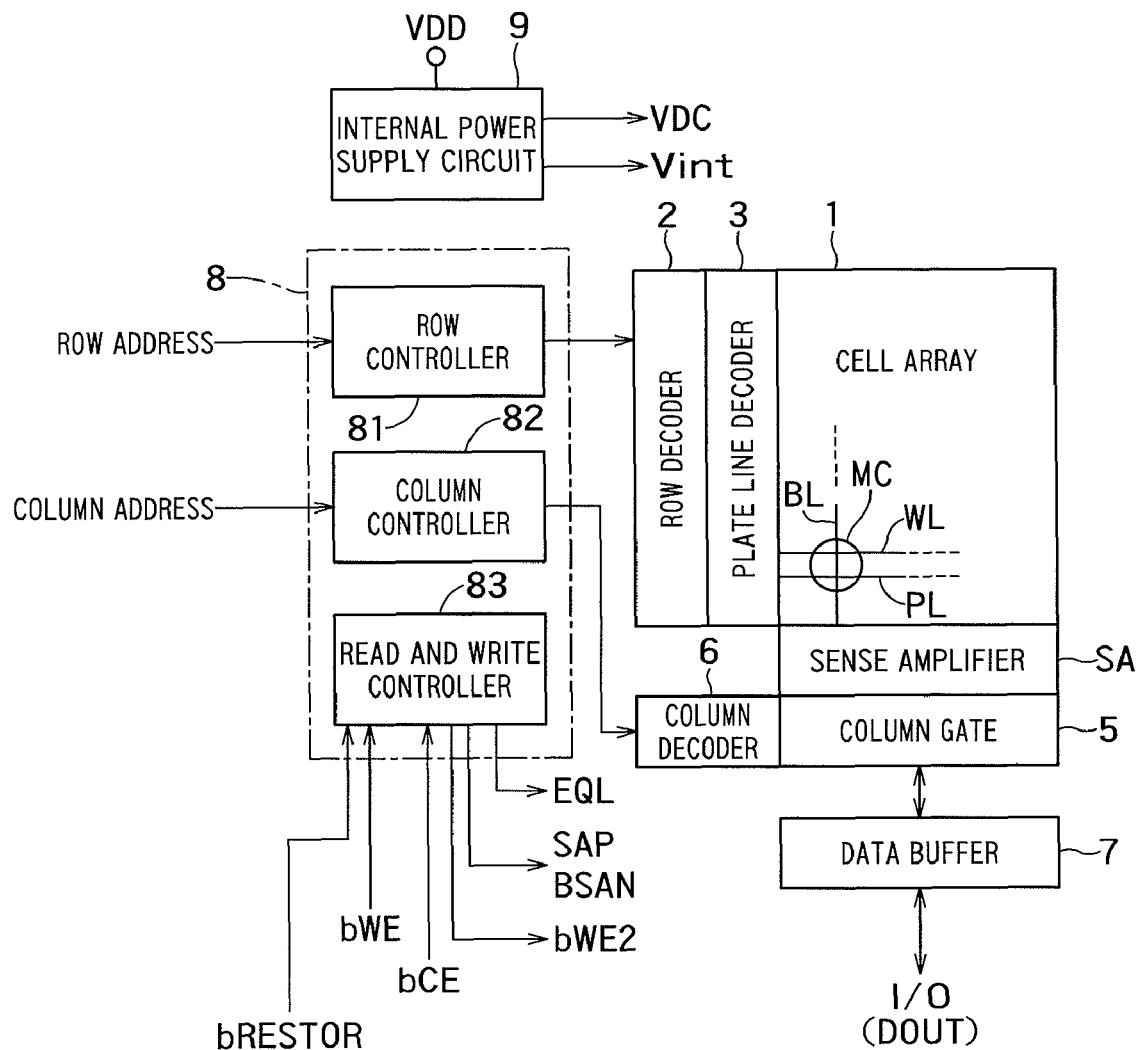
FIG. 1 is a block diagram showing a configuration of a ferroelectric memory according to a first embodiment.

FIG. 1 is a block diagram showing a configuration of a ferroelectric memory according to a first embodiment. The ferroelectric memory according to the first embodiment can be a memory which consists of series connected memory cells each having a transistor having a source terminal and a drain terminal and a ferroelectric capacitor inbetween said two terminals, hereafter named "Series connected TC unit type ferroelectric RAM".

The first embodiment can be applied not only to the Series connected TC unit type ferroelectric RAM, but also to other types of ferroelectric memories. Furthermore, the first embodiment can be applied not only to the ferroelectric memory but also to other types of memories that require the reference voltage.

A memory cell array 1 includes a plurality of memory cells MC each consisting of a ferroelectric capacitor and a cell transistor, being arranged in a two-dimensional array. The memory cell MC is arranged at every points of intersection of bit lines BL and word lines WL (every points of intersection of bit lines BL and plate lines PL).

A row decoder 2 activates a selected word line WL from among a plurality of word lines WL. A plate line decoder 3 activates a selected plate line PL from among a plurality of plate lines PL. A row controller 81 selects a word line WL and a plate line PL on a certain target row based on a row address received from outside, and controls the row decoder 2 and the plate line decoder 3 in order to activate the selected word line WL and plate line PL.

A column decoder 6 selects a bit line BL from among a plurality of bit lines BL via a column gate 5. A sense amplifier SA is configured to read data stored in the memory cell MC or write data in the memory cell MC via the selected bit line BL. The reference voltage VDC is used when the sense amplifier SA detects data. A column controller 82 controls the column decoder 6 to select a bit line BL on a target column based on a column address received from outside.

A data buffer 7 is configured to temporarily store read data that is detected by the sense amplifier SA and to output the read data to outside of a memory chip via an I/O circuit.

Alternatively, the data buffer 7 is configured to transfer write data input from outside via the I/O circuit to the sense amplifier SA on a selected column.

A read operation of reading out data to outside is an operation of detecting data stored in the memory cell MC by the sense amplifier SA and outputting the read data to outside of the memory chip via the data buffer 7 and the I/O circuit. The read operation includes a restore operation of writing data latched in the sense amplifier SA back in the original memory cell MC. A write operation of writing data received from outside is operations of transferring write data input from outside to the sense amplifier SA via the I/O circuit and the data buffer 7 and of writing the write data in the memory cell MC by the sense amplifier SA, after the sense amplifier SA detects data in the read operation.

A read/write controller 83 is configured to receive a chip enable signal bCE, a write enable signal bWE, and a restore signal bRESTOR from outside and to generate an equalizer signal EQL, sense amplifier activation signals SAP and BSAN, and the like.

The chip enable signal bCE is a signal for activating the memory chip so that the memory can be accessed. The write enable signal bWE is a signal for permitting either the write operation or the read operation. The restore signal bRESTOR is a signal for maintaining an activation state of the ferroelectric memory from an entry of the read operation until the end of the restore operation.

An internal power supply circuit 9 is configured to receive the external power source voltage VDD and to generate an internal power source voltage Vint and the reference voltage VDC. The internal power source voltage Vint is supplied to each on the components shown in FIG. 1. The external power source voltage VDD itself is also used to activate the bit line BL and the plate line PL, as the array voltage. The reference voltage VDC is an intermediate voltage between data "1" and data "0", which is used for detecting the data "1" or the data "0" at the time of detecting data. The internal power supply circuit 9 can include a voltage booster circuit or a voltage step-down circuit as appropriate.

The ferroelectric memory according to the first embodiment is activated when a pre-charge state (standby state) is over and a logical value of the chip enable signal bCE supplied from outside of the chip becomes low. With the ferroelectric memory being activated, a controller 8 including the row controller 81, the column controller 82, and the read/write controller 83 permits an access to the memory cell array 1.

Figure 2:
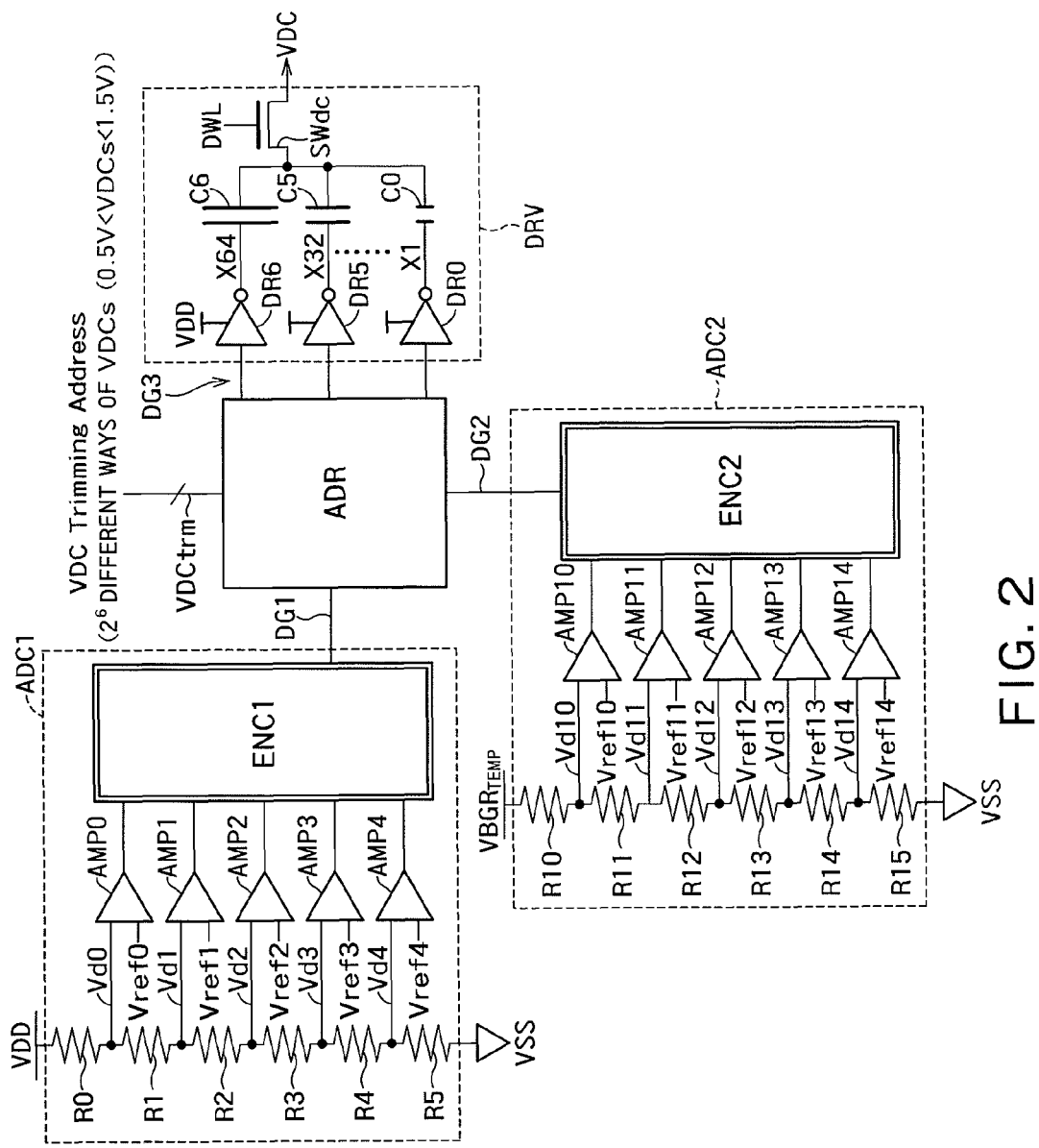
FIG. 2 is a block diagram showing an internal voltage generator according to the first embodiment.

FIG. 2 is a block diagram showing an internal voltage generator according to the first embodiment. The internal voltage generator is incorporated in the internal power supply circuit 9 shown in FIG. 1, and generates the reference voltage VDC (Voltage of Dummy Capacitor). The internal voltage generator is a circuit that generates the reference voltage VDC that is used as a reference potential when the sense amplifier SA detects data stored in the memory cell array 1. The internal voltage generator includes a first AD converter ADC1, a second AD converter ADC2, an adder ADR, and a driver DRV.

The first AD converter ADC1 is configured to convert the external power source voltage VDD into a first digital value DG1. More specifically, the first AD converter ADC1 includes resistors R0 to R5 that are connected in series between the external power source (VDD) and a low potential source (VSS), operational amplifiers AMP0 to AMP4 that compare divided voltages obtained by dividing the external power source voltage VDD by the resistors R0 to R5 with reference voltages Vref0 to Vref4, respectively, and amplify the divided voltages, and a first encoder ENC1 that converts a result output from the operational amplifiers AMP0 to AMP4 into the first binary digital value DG1.

In the first embodiment, it suffices that the reference voltages Vref0 to Vref4 have the same potential. In addition, it suffices that the operational amplifiers AMP0 to AMP4 have the same configuration. In this case, outputs of the operational amplifiers AMP0 to AMP4 are determined by voltages Vd0 to Vd4 which are obtained by dividing the external power source voltage VDD by the resistors R0 to R5, respectively. Among the voltages Vd0 to Vd4, the voltage Vd0 is the highest voltage, followed by the voltage Vd1, the voltage Vd2, the voltage Vd3, and the voltage Vd4 in descending order. When the external power source voltage VDD is so low that the voltage Vd0 is lower than the reference voltage Vref0, the operational amplifiers AMP0 to AMP4 output low level potentials. When the external power source voltage VDD increases gradually and the voltage Vd0 exceeds the reference voltage Vref0, the operational amplifier AMP0 exclusively outputs a high level potential. The other operational amplifiers AMP1 to AMP4 output the low level potentials. After that, when the voltage Vd1 exceeds the reference voltage Vref1, the operational amplifiers AMP0 and AMP1 output high level potentials. Similarly, when the external power source voltage VDD increases, the outputs of the operational amplifiers AMP2, AMP3, and AMP4 are changed from the low level potentials to high level potentials in order.

The encoder ENC1 receives the outputs of the operational amplifiers AMP0 to AMP4 and converts the outputs into the first binary digital value DG1. For example, when all the operational amplifiers AMP0 to AMP4 output low level potentials, the encoder ENC1 outputs (00000) as the first digital value DG1. When the operational amplifier AMP0 outputs exclusively a high level potential, the encoder ENC1 outputs (00001) as the first digital value DG1. Furthermore, when the operational amplifiers AMP0 and AMP1 output high level potentials, the encoder ENC1 outputs (00010) as the first digital value DG1. Similarly, every time the outputs of the operational amplifiers AMP2, AMP3, and AMP4 change from low level potentials to high level potentials, the encoder ENC1 outputs (00011), (00100), and (00101) as the first digital value DG1 in turn.

The second AD converter ADC2 is configured to convert a temperature characteristic voltage $VBGR_{TEMP}$ into a second digital value DG2. The temperature characteristic voltage $VBGR_{TEMP}$ is a bandgap reference voltage that changes with a temperature of a semiconductor chip. The temperature characteristic voltage $VBGR_{TEMP}$ is generated by a circuit shown in FIG. 3.

More specifically, the second AD converter ADC2 includes resistors R10 to R15 connected in series between the temperature characteristic voltage $VBGR_{TEMP}$ and the low potential source VSS, operational amplifiers AMP10 to AMP14 that compare divided voltages obtained by dividing the temperature characteristic voltage $VBGR_{TEMP}$ by the resistors R10 to R15 with reference voltages Vref10 to Vref14, respectively, and amplify the divided voltages, and a second encoder ENC2 that converts a result output from the operational amplifiers AMP10 to AMP14 into the second digital value DG2.

In the first embodiment, it suffices that the reference voltages Vref10 to Vref14 have the same potential. In addition, it suffices that the operational amplifiers AMP10 to AMP14 have the same configuration. In this case, outputs of the operational amplifiers AMP10 to AMP14 are determined by voltages Vd10 to Vd14 that are obtained by dividing the temperature characteristic voltage $VBGR_{TEMP}$ by the resistors R10 to R15, respectively. Among the voltages Vd10 to Vd14, the voltage Vd10 is the highest voltage, followed by the voltage Vd11, the voltage Vd12, the voltage Vd13, and the voltage Vd14 in descending order. When the temperature characteristic voltage $VBGR_{TEMP}$ is so low that the voltage Vd10 is lower than the reference voltage Vref10, the operational amplifiers AMP10 to AMP14 output low level potentials. When the temperature characteristic voltage $VBGR_{TEMP}$ increases gradually and the voltage Vd10 exceeds the reference voltage Vref10, the operational amplifier AMP10 exclusively outputs a high level potential. The other operational amplifiers AMP11 to AMP14 output the low level potentials. After that, when the voltage Vd11 exceeds the reference voltage Vref11, the operational amplifiers AMP10 and AMP11 output high level potentials. Similarly, when the temperature characteristic voltage $VBGR_{TEMP}$ increases, the outputs of the operational amplifiers AMP12, AMP13, and AMP14 are changed from the low level potentials to high level potentials in order.

The encoder ENC2 receives the outputs of the operational amplifiers AMP10 to AMP14 and converts the outputs into the second binary digital value DG2. For example, when all the operational amplifiers AMP10 to AMP14 output low level potentials, the encoder ENC2 outputs (00000) as the second digital value DG2. When the operational amplifier AMP10 outputs exclusively a high level potential, the encoder ENC2 outputs (00001) as the second digital value DG2. Furthermore, when the operational amplifiers AMP10 and AMP11 output high level potentials, the encoder ENC2 outputs (00010) as the second digital value DG2. Similarly, every time the outputs of the operational amplifiers AMP12, AMP13, and AMP14 change from low level potentials to high level potentials, the encoder ENC2 outputs (00011), (00100), and (00101) as the second digital value DG2 in turn.

The adder ADR receives the first digital value DG1 from the first AD converter ADC1, the second digital value DG2 from the second AD converter ADC2, and a reference voltage trimming address VDCtrm, and outputs a third digital value DG3 obtained by adding up the first digital value DG1, the second digital value DG2, and the reference voltage trimming address VDCtrm. The reference voltage trimming address VDCtrm is an address specifying a magnitude of the reference voltage VDC. After manufacturing a memory chip, the reference voltage trimming address VDCtrm is determined in such a manner that the internal voltage generator outputs an optimum reference voltage VDC based on bit line potentials for transferring an actual data "0" and an actual data "1". For example, any one of 6-bit values (000000) to (111111) is output as the reference voltage trimming address VDCtrm such that the reference voltage VDC is set to a predetermined voltage in a range from 0.5 volts to 1.5 volts. However, the reference voltage trimming address VDCtrm does not respond to changes of the external power source voltage VDD and the temperature of the memory chip, so that the reference voltage trimming address VDCtrm is constant without depending on the temperature and the external power source voltage VDD.

The first digital value DG1 takes six sets of values from (00000) to (00101), the second digital value DG2 takes six sets of values from (00000) to (00101), and the reference voltage trimming address VDCtrm outputs a 6-bit value ($2^6$ sets). The third digital value DG3 is calculated by a digital processing of a synthesis function operation of the first digital value DG1, the second digital value DG2, and the reference voltage trimming address VDCtrm. For example, the synthesis function operation is executed by adding up values obtained by multiplying the first digital value DG1, the second digital value DG2, and the reference voltage trimming address VDCtrm by weighting coefficients $\alpha$, $\beta$, $\gamma$, and $\delta$, respectively. That is, the third digital value DG3 is represented by $\alpha DG1 + \beta DG2 + \gamma VDCtrm + \delta$, for example. Hereinafter, this synthesis function operation is also referred to as weighted addition. The weighting coefficients $\alpha$, $\beta$, $\gamma$, and $\delta$ are set based on the characteristics of an actual device.

More specifically, because the driver DRV generates the VDC with the VDD as a power source, the VDC increases in proportional to the VDD, when $\alpha$ equals zero. The weighting coefficient $\alpha$ determines a dependence of the VDC on the VDD. If it is desired to set the dependence of the VDC on the VDD larger than the proportion to the VDD, $\alpha$ is set larger than zero, and if it is desired to set the dependence of the VDC on the VDD smaller than the proportion to the VDD, $\alpha$ is set smaller than zero. That is, if a fluctuation of the output voltage VDC of the driver DRV shown in FIG. 2 is larger than a predetermined value with respect to a fluctuation of the external power source voltage VDD, $\alpha$ is set larger than zero, and if the fluctuation of the output voltage VDC is smaller than the predetermined value, $\alpha$ is set smaller than zero. An absolute value of $|\alpha|$ can be set to an arbitrary value according to the characteristics of the actual device.

Furthermore, if the fluctuation of the output voltage VDC is larger than a predetermined value with respect to a fluctuation of the temperature of the semiconductor chip, $\beta$ is set larger than zero, and if the fluctuation of the output voltage VDC is smaller than the predetermined value, $\beta$ is set smaller than zero. An absolute value of $|\beta|$ can also be set to an arbitrary value according to the characteristics of the actual device.

Values of $\gamma$ and $\delta$ are determined based on a trimming range, the minimum value of a trimming, and a maximum value of the trimming. Normally, both $\gamma$ and $\delta$ are positive integers.

The adder ADR that performs the above weighted addition can be simply implemented by combining a simple adder circuit, a subtractor circuit, and an integrator circuit. Therefore, detailed explanations on its configuration will be omitted.

When the potentials of the bit line and the plate line are constant without depending on the VDD, in order to keep the output voltage VDC constant with respect to the VDD, the digital value to be added in the adder ADR needs to be compensated negatively. That is, in order to keep the output voltage VDC constant with respect to the VDD, the weighting coefficient $\alpha$ is set to a negative value. In this case, it is possible to keep the VDC substantially constant by digitally compensating an amount of increase of the VDC due to the VDD in a subtracting manner.

Figure 5:
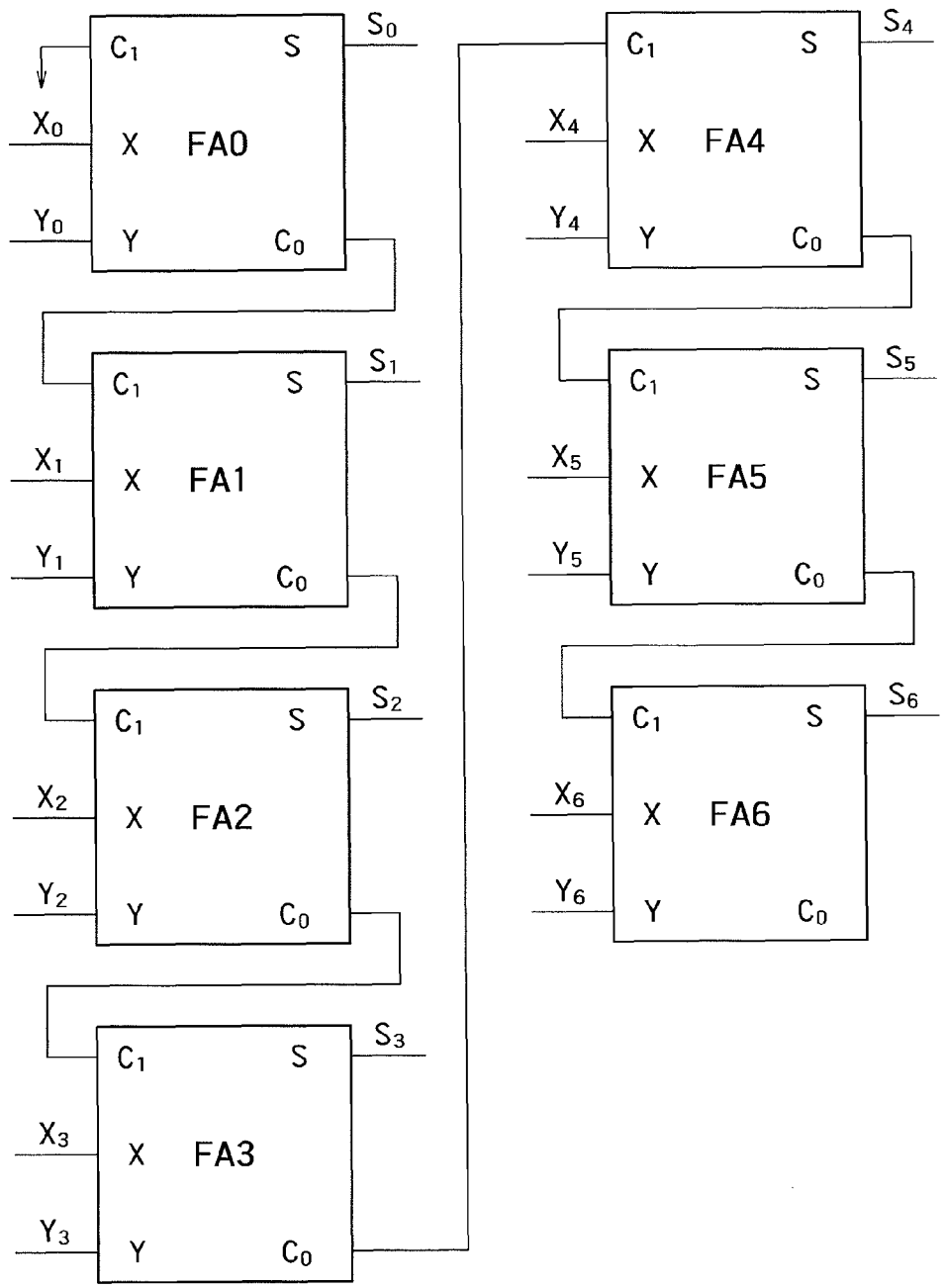
FIG. 5 is a schematic diagram showing a configuration of the adder ADR.

It is possible to set $\alpha=\beta=1$ by adjusting values of the resistors R0 to R5 and R10 to R15 shown in FIG. 2. Furthermore, by setting the trimming range of the VDC to pass through 0 volts (the origin) with $\gamma=1$ and $\delta=0$, the adder ADR can be configured with simple adders shown in FIG. 5. The following explanations are about an embodiment in which the adders shown in FIG. 5 are used.

The driver DRV receives the third digital value DG3 and outputs the reference voltage VDC according to the third digital value DG3. The driver DRV includes drive elements DR0 to DR6, capacitors C0 to C6, and a switch SWdc. The drive elements DR0 to DR6 are provided corresponding to the capacitors C0 to C6, respectively, and drive each of the capacitors C0 to C6 based on a binary value of each bit of the third digital value DG3. For example, if the third digital value DG3 is (0111010), the drive elements DR1 and DR3 to DR5 drive their corresponding capacitors C1 and C3 to C5, respectively.

The capacitors C0 to C6 have different capacitances from each other, and are configured in such manner that the capacitance increases with increase of digit of the third digital value DG3. For example, when the capacitor C0 corresponding to the least significant bit of the third digital value DG3 is set to a reference capacitance Cref, the capacitance of the capacitor C1 corresponding to the second digit bit of the DG3 is 2×Cref. The capacitance of the capacitor C2 corresponding to the third digit bit of the DG3 is 4×Cref. Furthermore, the capacitance of the capacitor C3 corresponding to the fourth digit bit of the DG3 is 8×Cref. Similarly, the capacitance of a capacitor Cn−1 corresponding to n-th digit bit ($1 \leq n \leq 7$) of the DG3 is $2^{n-1}$×Cref.

Therefore, when the third digital value DG3 is (0111010) as is the case in the above example, the total capacitance of the capacitors C1 and C3 to C5 that are driven by the drive elements DR1 and DR3 to DR5 becomes 58×Cref.

One end of each of the capacitors C0 to C6 is connected to the switch SWdc, and eventually, the capacitors C0 to C6 are connected to an output terminal via the switch SWdc. Therefore, a voltage proportional to the sum of the capacitances of the capacitors driven by the drive elements is output as the reference voltage VDC.

Figure 3:
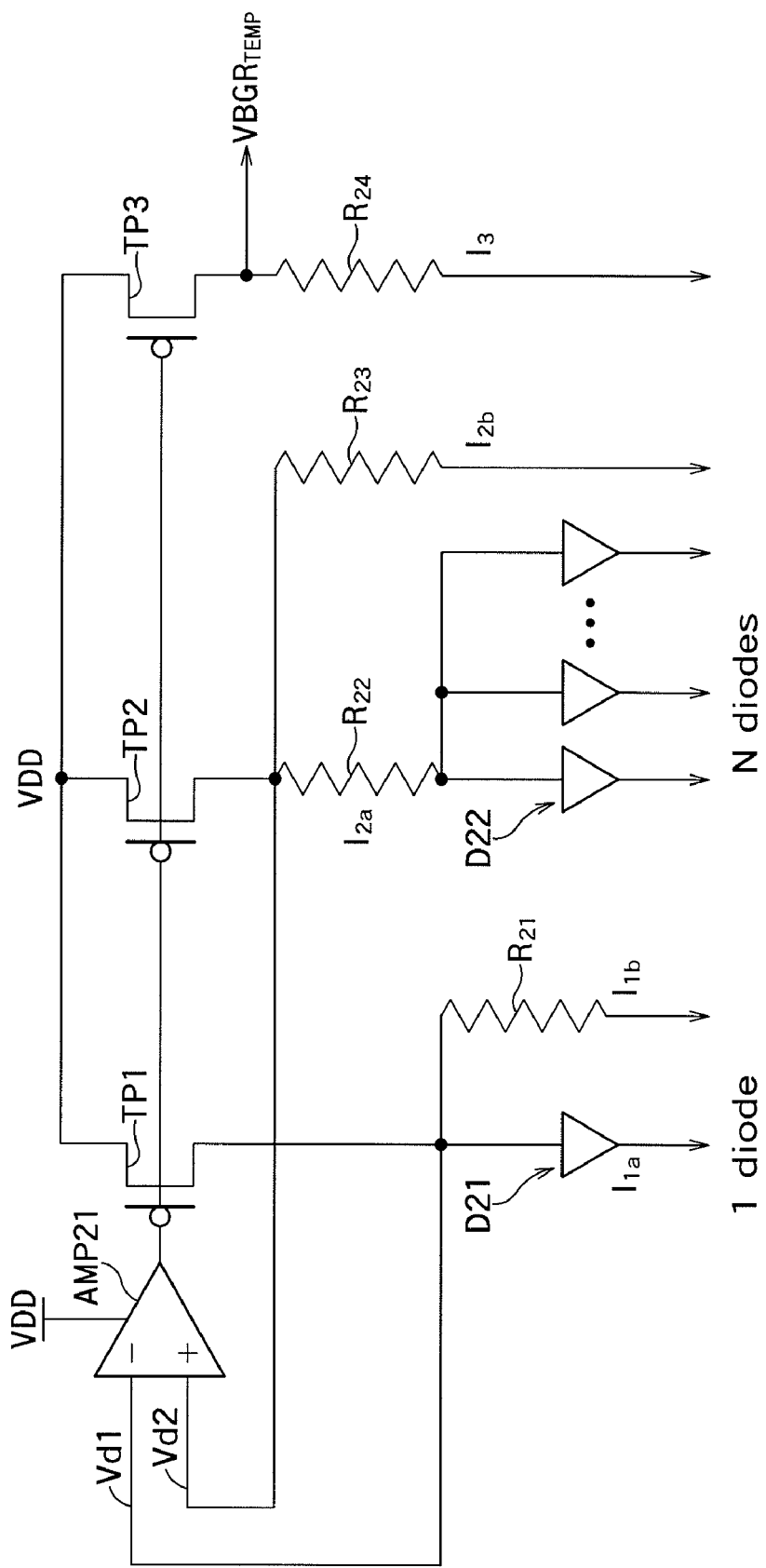
FIG. 3 is a circuit diagram showing a circuit for generating the temperature characteristic voltage $VBGR_{TEMP}$.

FIG. 3 is a circuit diagram showing a circuit for generating the temperature characteristic voltage $VBGR_{TEMP}$ (hereinafter, "$VBGR_{TEMP}$ generator"). An output unit of the $VBGR_{TEMP}$ generator is connected to an input unit of the second AD converter ADC2 for the $VBGR_{TEMP}$ shown in FIG. 2.

The $VBGR_{TEMP}$ generator includes first to third transistors TP1 to TP3, first and second diodes D21 and D22, and first to fourth resistor units R21 to R24. The external power source voltage VDD is applied to sources of the first to third transistors TP1 to TP3. The first diode D21 and the first resistor unit R21 are connected in parallel between a drain of the first transistor TP1 and the low potential source VSS. One end of the second resistor unit R22 is connected to a drain of the second transistor TP2. The second diode D22 is connected between other end of the second resistor unit R22 and the low potential source VSS, and has a dimension n times larger than that of the first diode D21 (n>1). The third resistor unit R23 is connected between the drain of the second transistor TP2 and the low potential source VSS. The fourth resistor unit R24 is connected between a drain of the third transistor TP3 and the low potential source VSS.

The $VBGR_{TEMP}$ generator further includes an operational amplifier AMP21 that receives a drain voltage Vd1 of the first transistor TP1 and a drain voltage Vd2 of the second transistor TP2 and outputs a voltage difference (Vd2−Vd1) between the drain voltage Vd1 and the drain voltage Vd2 to gates of the first to third transistors TP1 to TP3. A drain voltage of the third transistor TP3 is output as the temperature characteristic voltage $VBGR_{TEMP}$.

The second diode D22 can be configured with n diodes of the same type as the first diode D21 connected in parallel.

In the circuit shown in FIG. 3, the temperature characteristic voltage $VBGR_{TEMP}$ is determined by a resistance ratio of the resistor units R21 to R24. In this case, it is possible to set a dependence of the temperature characteristic voltage $VBGR_{TEMP}$ on the temperature by simply setting only the second resistor unit R22.

Figure 4:
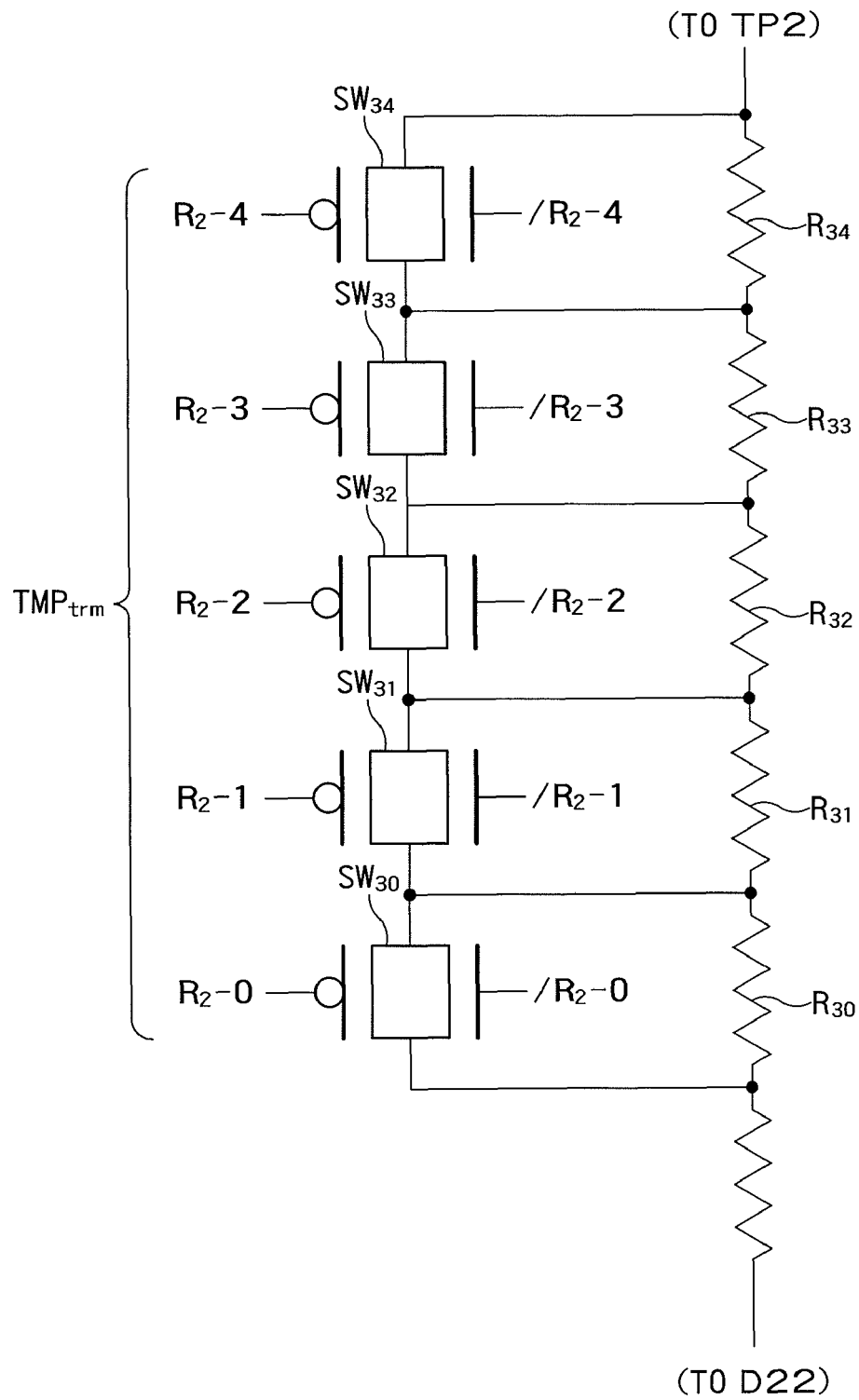
FIG. 4 is a circuit diagram showing a configuration of the second resistor unit R22 in detail.

FIG. 4 is a circuit diagram showing a configuration of the second resistor unit R22 in detail. The temperature characteristic voltage $VBGR_{TEMP}$ has a temperature characteristic that is determined by the first to fourth resistor units R21 to R24. Furthermore, it is possible to change a degree of dependence (amount of dependence) of the temperature characteristic voltage $VBGR_{TEMP}$ on the temperature by making up the second resistor unit R22 as shown in FIG. 4. The degree of dependence (amount of dependence) on the temperature indicates an amount of change of the temperature characteristic voltage $VBGR_{TEMP}$ with respect to a change of temperature of a memory chip. Therefore, a high degree of dependence (amount of dependence) indicates a large amount of change of the temperature characteristic voltage $VBGR_{TEMP}$ with respect to the change of the temperature of the memory chip. In other words, it can be said that the temperature characteristic voltage $VBGR_{TEMP}$ is sensitive to the temperature of the memory chip. As can be seen from FIG. 2, a high degree of dependence of the temperature characteristic voltage $VBGR_{TEMP}$ on the temperature means a high degree of dependence of the reference voltage VDC on the temperature. For example, the degree of dependence of the temperature characteristic voltage $VBGR_{TEMP}$ on the temperature is proportional to the degree of dependence of the reference voltage VDC on the temperature.

The second resistor unit R22 includes resistors R30 to R34 connected in series between the second transistor TP2 and the second diode D22 and switching elements SW30 to SW34 connected in parallel to the resistors R30 to R34, respectively. Each of the switching elements SW30 to SW34 is a CMOS switch consisting of an N type FET and a P type FET connected in parallel. A resistance ratio of the resistors R30 to R34 is R30:R31:R32:R33:R34=1:2:4:8:16.

After a ferroelectric memory is formed, the temperature characteristic voltage $VBGR_{TEMP}$ or the reference voltage VDC is measured, and a setting of a dependence of the second resistor unit R22 on the temperature is determined for each of chips, wafers, or lots. For example, when the dependence of a memory cell on the temperature is high in a chip, a wafer, or a lot, the dependence of the second resistor unit R22 on the temperature is to be increased. In the second resistor unit R22 shown in FIG. 4, it is possible to change the resistance of the second resistor unit R22 in $2^5$ ways by changing settings of the switching elements SW30 to SW34. A temperature characteristic trimming address $R_2$-0 to $R_2$-4 (hereinafter, also "TMPtrm") is fixed to appropriately set the resistance of the second resistor unit R22 after measuring the temperature characteristic voltage $VBGR_{TEMP}$ or the reference voltage VDC. With this operation, it is possible to set the dependences of the temperature characteristic voltage $VBGR_{TEMP}$ and the reference voltage VDC on the temperature for each of the chips, the wafers, or the lots. It is preferable that a setting of the temperature characteristic trimming address TMPtrm be performed at a test process before dicing, after forming the ferroelectric memory on a wafer.

FIG. 5 is a schematic diagram showing a configuration of the adder ADR. The adder ADR includes seven full adder circuits FA0 to FA6. A processing of the adder ADR is as follows. A configuration of each of the full adder circuits FA0 to FA6 can be the same as that of a conventional full adder circuit.

First, binary values of the least significant bit to the most significant bit of the reference voltage trimming address VDCtrm are input to first inputs X0 to X5 of the six full adder circuits FA0 to FA5, respectively. Initially, "0" is input to a first input X6 of the full adder circuit FA6. Subsequently, binary values of the least significant bit to the most significant bit of the first digital value DG1 are input to second inputs Y0 to Y5 of the full adder circuits FA0 to FA5, respectively. The adder ADR performs an addition of the first inputs X0 to X5 and the second inputs Y0 to Y5. At this time, the adder ADR can perform the above-described weighted addition (αDG1+γVDCtrm). After that, values of a result of the addition are re-input to the first inputs X0 to X6, respectively, by which the adder ADR temporarily stores the result of the addition. Furthermore, binary values of the least significant bit to the most significant bit of the second digital value DG2 are input to the second inputs Y0 to Y5, respectively. The adder ADR performs the addition of the first inputs X0 to X6 and the second inputs Y0 to Y5 again. At this time, the adder ADR can perform the above-described weighted addition ((result of the first addition)+βDG2+δ). A result of the addition S0 to S6 is output to the driver DRV as the third digital value DG3. With the weighted addition, the DG3 becomes αDG1+γVDCtrm+ βDG2+δ. As a result, it is possible for the internal voltage generator according to the first embodiment to generate the reference voltage VDC that depends on the external power source voltage VDD (the array voltage) and the temperature of the memory chip.

Figure 6:
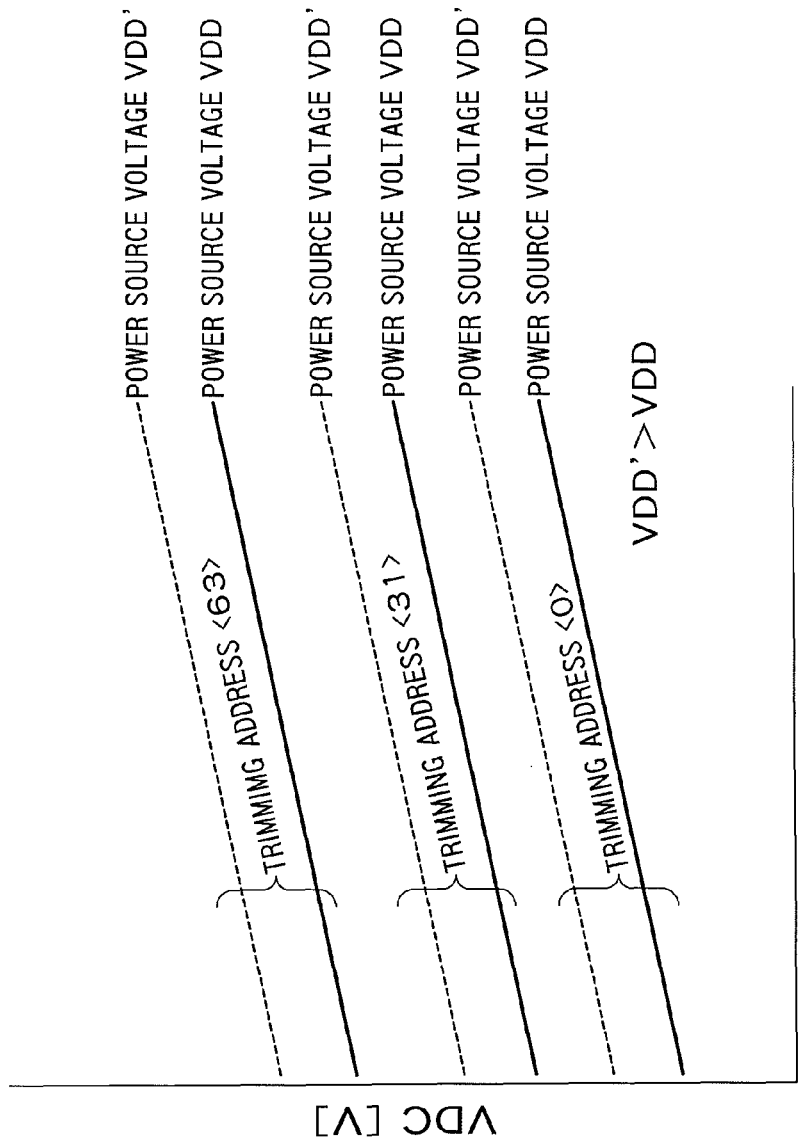
FIG. 6 is a graph showing a relation between the temperature T of the memory chip and the reference voltage VDC.

FIG. 6 is a graph showing a relation between the temperature T of the memory chip and the reference voltage VDC. From the graph shown in FIG. 6, it is found that the reference voltage VDC changes substantially in proportional to the temperature T of the memory chip. The slope of the graph indicates the dependence of the reference voltage VDC on the temperature. As the dependence on the temperature is high, the slope of the graph increases. When the external power source voltage VDD changes to VDD' (VDD'>VDD), the reference voltage VDC increases accordingly.

The internal voltage generator according to the first embodiment generates the reference voltage VDC that depends on the temperature of the memory chip and the external power source voltage VDD (or the array voltage), thus making it possible to suppress an erroneous data detection. Furthermore, with the internal voltage generator according to the first embodiment, it is possible to set the degree of dependence (amount of dependence) of the reference voltage VDC on the temperature in an arbitrary manner.

Second Embodiment

Figure 7:
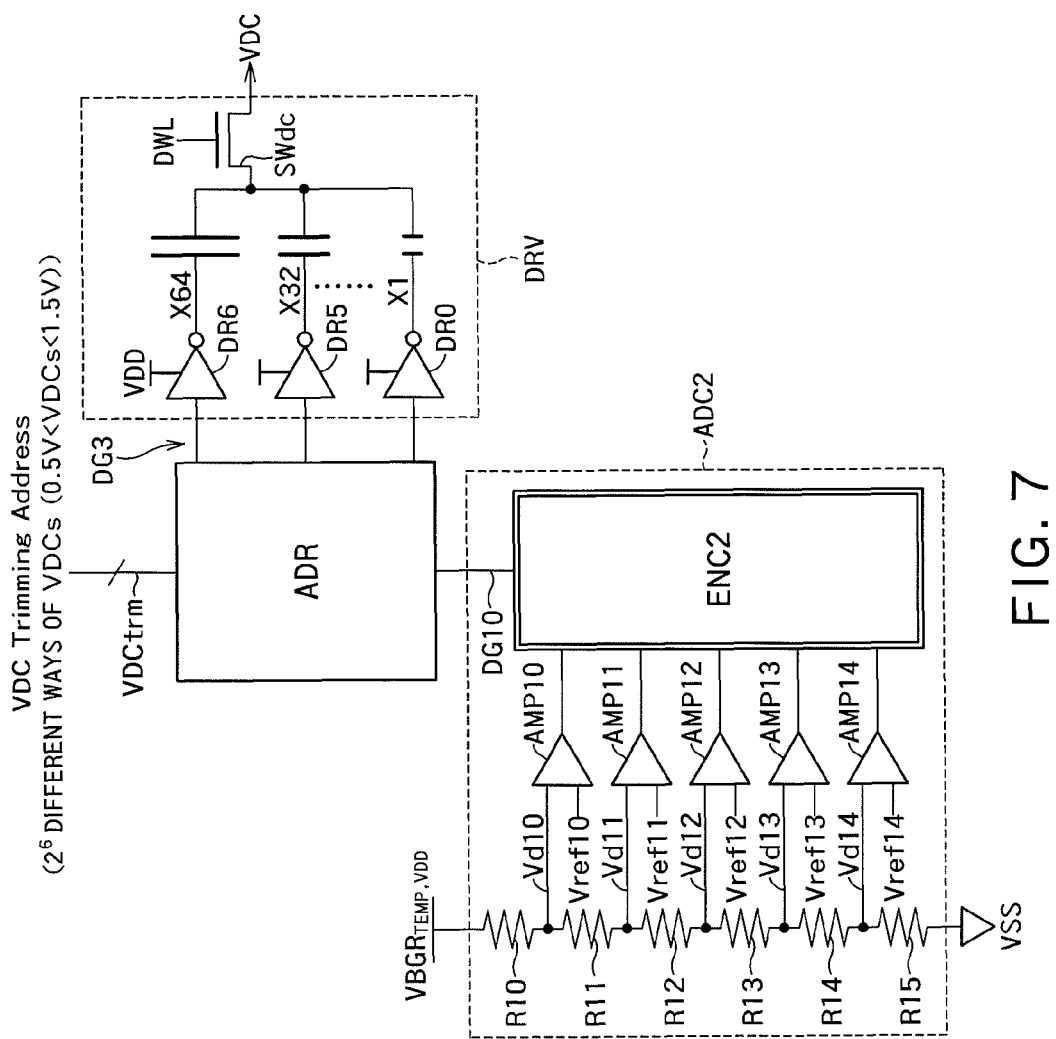
FIG. 7 is a block diagram showing a configuration of an internal voltage generator according to a second embodiment.

FIG. 7 is a block diagram showing a configuration of an internal voltage generator according to a second embodiment. The internal voltage generator according to the second embodiment includes only a second AD converter ADC2. A temperature characteristic voltage $VBGR_{TEMP,VDD}$ changes depending on both the temperature of the memory chip and the external power source voltage VDD. It means that a digital value DG10 is a value considering not only the temperature of the memory chip but also the external power source voltage VDD (the array voltage).

Configurations of an adder ADR, the driver DRV, the encoder ENC2, the operational amplifiers AMP10 to AMP14, and the resistors R10 to R15 of the second embodiment can be the same as those of the first embodiment.

Figure 8:
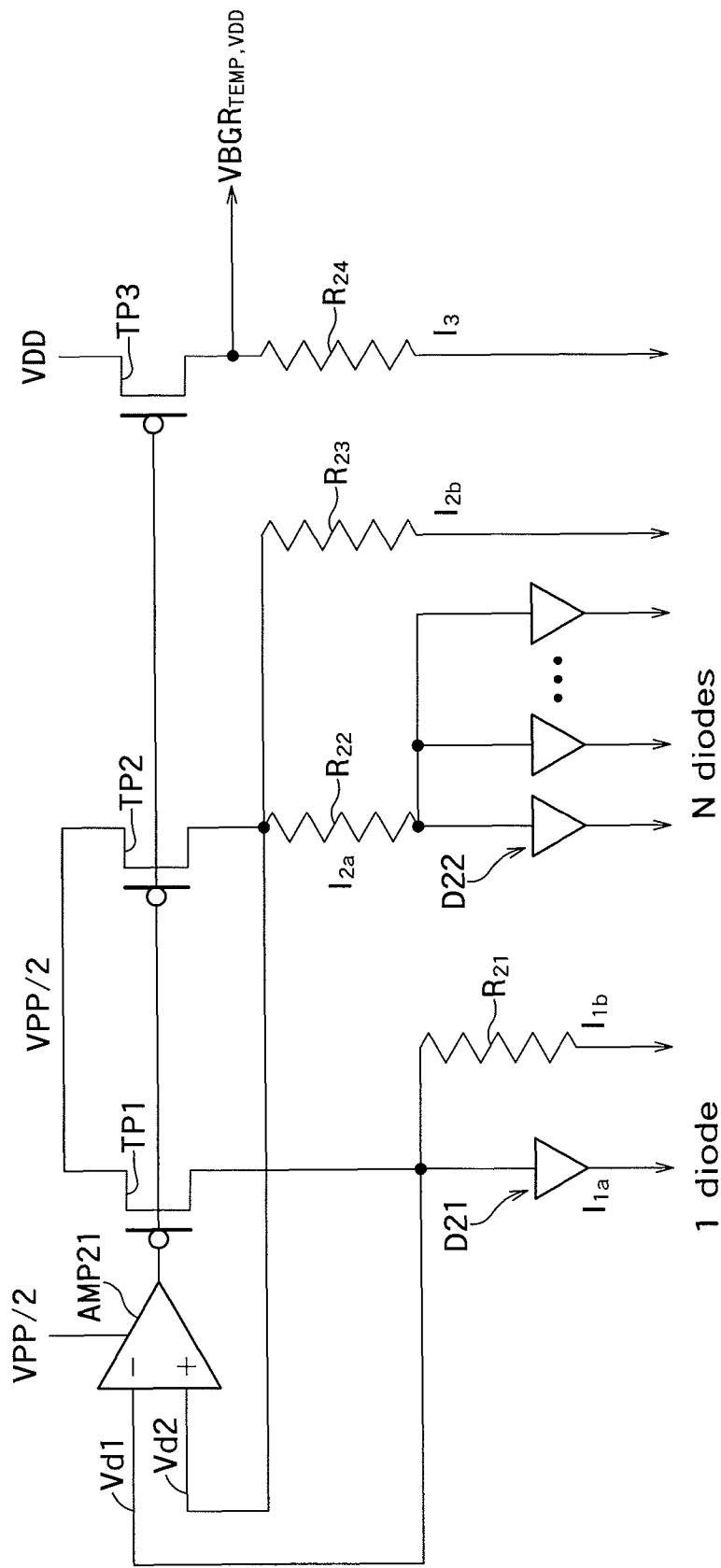
FIG. 8 is a circuit diagram showing a circuit for generating the temperature characteristic voltage $VBGR_{TEMP,VDD}$.

FIG. 8 is a circuit diagram showing a circuit for generating the temperature characteristic voltage $VBGR_{TEMP,VDD}$ (hereinafter, "$VBGR_{TEMP,VDD}$ generator"). In the $VBGR_{TEMP,VDD}$ generator, a voltage VPP/2, which is a half a high level potential VPP of a word line, is used as a power source for an operational amplifier AMP21. Furthermore, the voltage VPP/2 is also applied to sources of first and second transistors TP1 and TP2. The external power source voltage VDD is connected to a source of a third transistor TP3. A configuration of a second resistor unit R22 can be the same as that shown in FIG. 4. The other configurations of the $VBGR_{TEMP,VDD}$ generator can be the same as those of the $VBGR_{TEMP}$ generator shown in FIG. 3.

Figure 9:
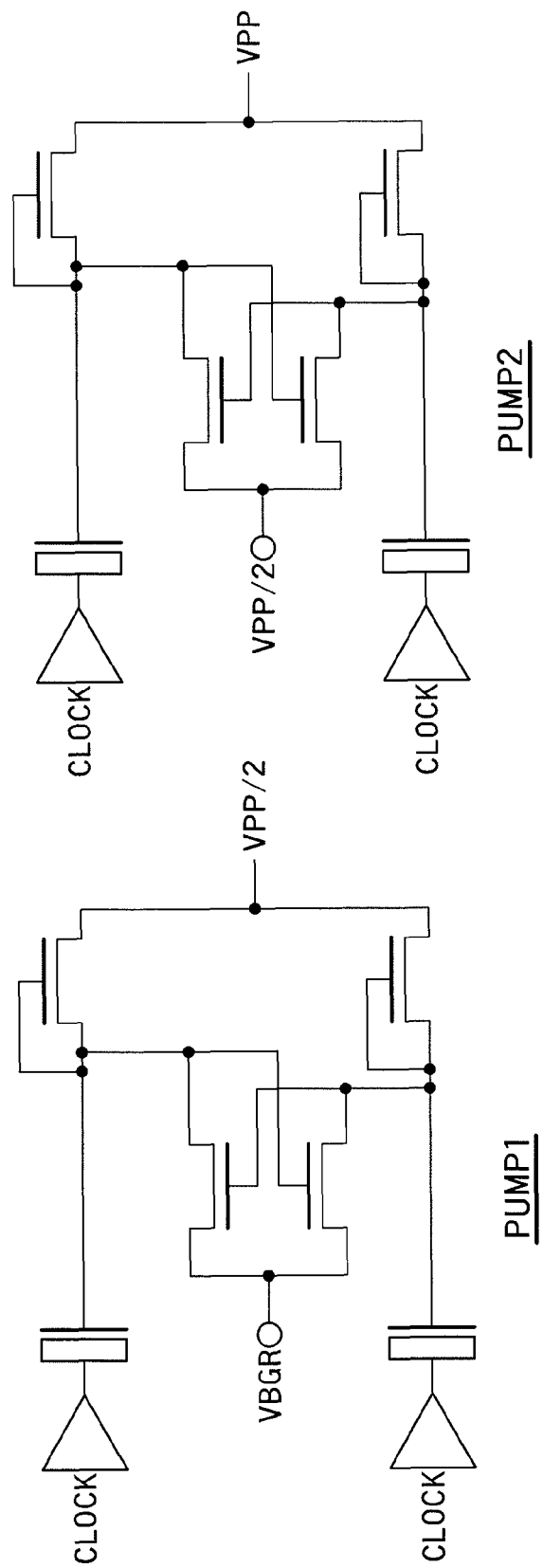
FIG. 9 is a schematic diagram showing two pump circuits PUMP1 and PUMP2.

The voltage VPP is a high level voltage of the word line WL, which is used for a non-selected word line at the time of reading data or writing data. The high level voltage VPP is generated by boosting a voltage generated from a conventional type voltage VBGR that does not depend on the temperature using a voltage booster. The voltage booster is composed of two pump circuits PUMP1 and PUMP2 as shown in FIG. 9. The voltage VPP/2 is an output voltage of the pump circuit PUMP1 at the first pumping stage that receives the voltage VBGR. The voltage VPP is an output voltage of the pump circuit PUMP2 at the second pumping stage that receives the voltage VPP/2.

The voltage VPP is a voltage that is generated with the voltage VBGR as a reference, without depending on the chip temperature and the external power source voltage VDD. Therefore, the operational amplifier AMP21 outputs a voltage that depends on the chip temperature without depending on the external power source voltage VDD. If the external power source voltage VDD increases with the chip temperature constant, a gate voltage of the third transistor TP3 does not changes but its source voltage increases. As a result, a current flowing through the third transistor TP3 increases, and the temperature characteristic voltage $VBGR_{TEMP,VDD}$ becomes a voltage that depends on the external power source voltage VDD.

On the other hand, if the chip temperature increases with the external power source voltage VDD constant, the gate voltage of the third transistor TP3 decreases. As a result, the current flowing through the third transistor TP3 increases, and the temperature characteristic voltage $VBGR_{TEMP,VDD}$ becomes a voltage that also depends on the chip temperature.

The encoder ENC2 shown in FIG. 7 converts the temperature characteristic voltage $VBGR_{TEMP,VDD}$ that depends on both the chip temperature and the external power source voltage VDD into the digital value DG10. The adder ADR adds up the digital value DG10 and the reference voltage trimming address VDCtrm. Because subsequent operations of the second embodiment are identical to those of the first embodiment, explanations thereof will be omitted.

The second embodiment can achieve effects identical to those of the first embodiment. Further, the second embodiment do not require the AD converter ADC1 exclusively used for the external power source voltage VDD. Therefore, the internal voltage generator according to the second embodiment can have a downscaled circuit size.

Third Embodiment

Figure 10:
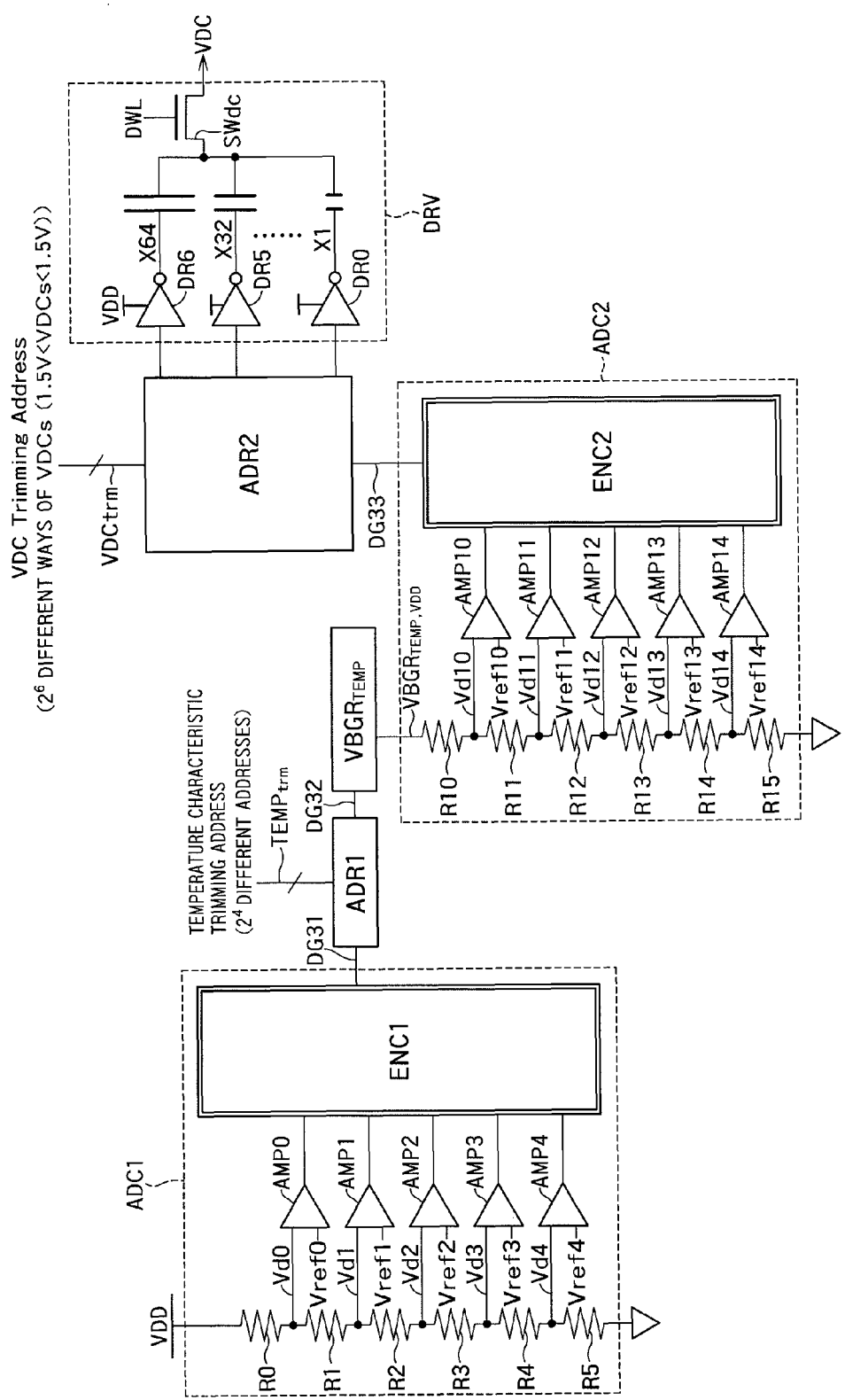
FIG. 10 is a block diagram showing a configuration of an internal voltage generator according to a third embodiment.

FIG. 10 is a block diagram showing a configuration of an internal voltage generator according to a third embodiment. The internal voltage generator according to the third embodiment includes a first adder ADR1 arranged between a first AD converter ADC1 and a $VBGR_{TEMP}$ generator and a second adder ADR2 arranged between a second AD converter ADC2 and the driver DRV.

In the third embodiment, the first adder ADR1 adds a first digital value DG31 depending on the external power source voltage VDD to the temperature characteristic trimming address TMPtrm received into the $VBGR_{TEMP}$ generator. Therefore, when the temperature characteristic trimming address TMPtrm is received into the $VBGR_{TEMP}$ generator as a second digital value DG32, the second digital value DG32 is a value in which the external power source voltage VDD is already considered.

Configurations of the first AD converter ADC1, the second AD converter ADC2, the $VBGR_{TEMP}$ generator, the second adder ADR2, and the driver DRV according to the third embodiment can be the same as those of the first AD converter ADC1, the second AD converter ADC2, the $VBGR_{TEMP}$ generator (see FIGS. 3 and 4), the adder ADR, and the driver DRV according to the first embodiment, respectively. A configuration of the first adder ADR1 can be basically the same as that of the adder ADR according to the first embodiment. However, it suffices that the number of full adder circuits in the first adder ADR1 be the same as the number of digits of a second digital value DG32.

In a similar manner to the first digital value DG1 in the first embodiment, the first digital value DG31 output from the first AD converter ADC1 can take six sets of values in response to the external power source voltage VDD. The temperature characteristic trimming address TMPtrm is, for example, a 4-bit signal. In this case, the second digital value DG32 can take any one of values from (00000) to (10101). It is also sufficient to configure the temperature characteristic trimming address TMPtrm and the first AD converter ADC1 such that the second digital value DG32 can take any one of values from (00000) to (11111). Ranges of the first to third digital values DG31 to DG33 are questions on the specifications, so that they can be set in an arbitrary manner.

The $VBGR_{TEMP}$ generator receives the second digital value DG32 as the temperature characteristic trimming address TMPtrm. The switching elements SW30 to SW34 shown in FIG. 4 are controlled by the second digital value DG32. At this time, switching elements SW30 to SW34 are set being considered with the dependence on the temperature and the external power source voltage VDD.

The second AD converter ADC2 receives the temperature characteristic voltage $VBGR_{TEMP,VDD}$ from the $VBGR_{TEMP}$ generator, and converts it into the third digital value DG33. Because an operation of the second AD converter ADC2 is the same as that in the first embodiment, detailed explanations thereof will be omitted.

The second adder ADR2 adds up the reference voltage trimming address VDCtrm and the third digital value DG33, and outputs a result of the addition to the driver DRV. In the third embodiment, the result of the addition from the second adder ADR2 is (0000000) to (1000101). Because subsequent operations of the third embodiment are identical to those of the first embodiment, explanations thereof will be omitted.

The third embodiment can achieve effects identical to those of the first embodiment.

In the first to third embodiments, each of the first and second digital values DG1, DG2 (DG3, DG4) outputs six sets of values. However, in order to further increase the dependence on the external power source voltage VDD and the dependence on the chip temperature, values that can be taken by the first and second digital values DG1, DG2 (DG3, DG4) can be increased. In this case, it suffices to increase pairs of the operational amplifier AMPi (where i is a positive integer) and the resistor Ri in the first AD converter ADC1 and the second AD converter ADC2.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fall within the scope and sprit of the invention.

The invention claimed is:

1. An internal voltage generator configured to generate a reference voltage for detecting data stored in a semiconductor memory, the generator comprising:

a first analog-to-digital (AD) converter configured to convert an external voltage supplied to the semiconductor memory into a first digital value;

a second AD converter configured to convert a temperature characteristic voltage, which changes depending on a temperature of the semiconductor memory, into a second digital value;

an adder configured to receive a reference voltage trimming address specifying the reference voltage, the first digital value, and the second digital value, and to output a third digital value that comprises a weighted sum of the reference voltage trimming address, the first digital value, and the second digital value; and a driver configured to output the reference voltage according to the third digital value.

2. The generator of claim 1, wherein
the adder is configured to temporarily store a weighted sum of the reference voltage trimming address and the first digital value, and
the adder is configured to output the third digital value that comprises a weighted sum of the second digital value, and the weighted sum of the reference voltage trimming address and the first digital value.

3. The generator of claim 1, further comprising a temperature characteristic voltage generator configured to generate the temperature characteristic voltage, wherein
the temperature characteristic voltage generator comprises:
first to third transistors comprising sources configured to receive the external voltage;
a first diode and a first resistor connected in parallel between a drain of the first transistor and a low potential source;
a second resistor comprising a first end connected to a drain of the second transistor;
a second diode connected between a second end of the second resistor and the low potential source, the second diode having a dimension n times larger than that of the first diode, where n is an integer larger than 1;
a third resistor connected between the drain of the second transistor and the low potential source;
a fourth resistor connected between a drain of the third transistor and the low potential source; and
an operational amplifier configured to receive a drain voltage of the first transistor and a drain voltage of the second transistor and to output a voltage difference between the drain voltage of the first transistor and the drain voltage of the second transistor to gates of the first to the third transistors, and
wherein the temperature characteristic voltage generator is configured to output a drain voltage of the third transistor as the temperature characteristic voltage.

4. The generator of claim 2, further comprising a temperature characteristic voltage generator configured to generate the temperature characteristic voltage, wherein
the temperature characteristic voltage generator comprises:
first to third transistors comprising sources configured to receive the external voltage;
a first diode and a first resistor connected in parallel between a drain of the first transistor and a low potential source;
a second resistor comprising a first end connected to a drain of the second transistor;
a second diode connected between a second end of the second resistor and the low potential source, the second diode having a dimension n times larger than that of the first diode, where n is an integer larger than 1;

a third resistor connected between the drain of the second transistor and the low potential source;

a fourth resistor connected between a drain of the third transistor and the low potential source; and an operational amplifier configured to receive a drain voltage of the first transistor and a drain voltage of the second transistor and to output a voltage difference between the drain voltage of the first transistor and the drain voltage of the second transistor to gates of the first to the third transistors, and wherein the temperature characteristic voltage generator is configured to output a drain voltage of the third transistor as the temperature characteristic voltage.

5. An internal voltage generator configured to generate a reference voltage for detecting data stored in a semiconductor memory, the generator comprising:

an analog-to-digital (AD) converter configured to convert an external voltage supplied to the semiconductor memory and a temperature characteristic voltage depending on a temperature of the semiconductor memory into digital values, respectively;

an adder configured to receive a reference voltage trimming address specifying the reference voltage and the digital values, the adder being configured to output a weighted sum of the reference voltage trimming address and the digital values;

a driver configured to output the reference voltage having a voltage value according to the result of addition of the adder; and a temperature characteristic voltage generator configured to generate the temperature characteristic voltage.

6. The generator of claim 5, wherein the temperature characteristic voltage generator comprises:

first and second transistors comprising sources to which a stable potential is applied, the stable potential being obtained from a voltage booster for generating a potential of a word line, without depending on the external voltage and the temperature of the semiconductor memory, a third transistor comprising a source to which the external voltage is applied;

a first diode and a first resistor connected in parallel between a drain of the first transistor and a low potential source;

a second resistor comprising a first end connected to a drain of the second transistor;

a second diode connected between a second end of the second resistor and the low potential source, the second diode having a dimension n times larger than that of the first diode, where n is an integer larger than 1;

a third resistor connected between the drain of the second transistor and the low potential source;

a fourth resistor connected between a drain of the third transistor and the low potential source; and an operational amplifier configured to receive a drain voltage of the first transistor and a drain voltage of the second transistor and to output a voltage difference between the drain voltage of the first transistor and the drain voltage of the second transistor to gates of the first to third transistors, and wherein the temperature characteristic voltage generator is configured to output a drain voltage of the third transistor as the temperature characteristic voltage.

7. An internal voltage generator configured to generate a reference voltage for detecting data stored in a semiconductor memory, the generator comprising:

a first analog-to-digital (AD) converter configured to convert an external voltage supplied to the semiconductor memory into a first digital value;

a first adder configured to receive a temperature characteristic trimming address and the first digital value, and to output a weighted sum of the temperature characteristic trimming address and the first digital value;

a second AD converter configured to receive the result of addition of the first adder, and to convert a temperature characteristic voltage, which depends on a temperature of the semiconductor memory, into a second digital value based on a temperature characteristic determined by the result of addition of the first adder;

a second adder configured to output a third digital value comprising a weighted sum of the reference voltage trimming address, which specifies the reference voltage, and the second digital value; and a driver configured to output the reference voltage according to the third digital value.

8. The generator of claim 7, further comprising a temperature characteristic voltage generator configured to generate the temperature characteristic voltage, wherein the temperature characteristic voltage generator comprises:

first to third transistors comprising sources configured to receive the external voltage;

a first diode and a first resistor connected in parallel between a drain of the first transistor and a low potential source;

a second resistor comprising a first end connected to a drain of the second transistor;

a second diode connected between a second end of the second resistor and the low potential source, the second diode having a dimension n times larger than that of the first diode, where n is an integer larger than 1;

a third resistor connected between the drain of the second transistor and the low potential source;

a fourth resistor connected between a drain of the third transistor and the low potential source; and an operational amplifier configured to receive a drain voltage of the first transistor and a drain voltage of the second transistor and to output a voltage difference between the drain voltage of the first transistor and the drain voltage of the second transistor to gates of the first to the third transistors, and wherein the temperature characteristic voltage generator is configured to output a drain voltage of the third transistor as the temperature characteristic voltage.

* * * * *